United States Patent [19]

Nagaseki et al.

[11] Patent Number: 5,368,676
[45] Date of Patent: Nov. 29, 1994

[54] PLASMA PROCESSING APPARATUS COMPRISING ELECTRON SUPPLY CHAMBER AND HIGH FREQUENCY ELECTRIC FIELD GENERATION MEANS

[75] Inventors: Kazuya Nagaseki, Yamanashi; Shuuji Mochizuki, Kofu, both of Japan

[73] Assignee: Tokyo Electron Limited, Tokyo, Japan

[21] Appl. No.: 164,874

[22] Filed: Dec. 9, 1993

Related U.S. Application Data

[63] Continuation of Ser. No. 861,386, Mar. 31, 1992, abandoned.

[30] Foreign Application Priority Data

Apr. 26, 1991 [JP] Japan ................... 3-122878

[51] Int. Cl.⁵ .................. H01L 21/00; C23C 16/50
[52] U.S. Cl. .................... 156/345; 118/719;
 118/723 FE; 118/723 E
[58] Field of Search .............. 156/345, 643;
 118/723 MP, 723 FE, 723 E; 204/298.01,
 298.05, 298.36, 298.37, 298.39, 298.41;
 315/111.81

[56] References Cited

U.S. PATENT DOCUMENTS

| | | | |
|---|---|---|---|
| 4,175,029 | 11/1979 | Kovalsky et al. | 204/298 |
| 4,269,137 | 5/1981 | Johnson | 118/723 X |
| 4,749,587 | 7/1988 | Bergmann et al. | 427/37 |
| 4,871,918 | 10/1989 | Miljevic | 315/111.81 X |
| 4,877,505 | 10/1989 | Bergmann | 204/192.12 X |
| 4,878,995 | 11/1989 | Arikado et al. | 156/345 X |
| 5,147,497 | 9/1992 | Nozawa et al. | 156/345 X |

FOREIGN PATENT DOCUMENTS

| | | |
|---|---|---|
| 0031704 | 7/1981 | European Pat. Off. . |
| 0061906 | 10/1982 | European Pat. Off. . |
| 51-38036 | 10/1976 | Japan . |
| 60-10731 | 1/1985 | Japan . |
| 0270320 | 10/1989 | Japan ................... 118/723 |
| 2109236 | 4/1990 | Japan ................... 118/723 |
| 2178228 | 4/1987 | United Kingdom . |
| WO91/13458 | 9/1991 | WIPO . |

OTHER PUBLICATIONS

Patent Abstracts of Japan, vol. 9, No. 123, (E-317) [1846], May 28, 1985, & JP-A-60-10731, Jan. 19, 1985, A. Sudou, "Plasma Etching Device".

*Primary Examiner*—R. Bruce Breneman
*Assistant Examiner*—Jonathan D. Baskin
*Attorney, Agent, or Firm*—Oblon, Spivak, McClelland, Maier & Neustadt

[57] ABSTRACT

A plasma etching apparatus provided with a processing chamber adjustable to be highly decompressed. A pair of parallel electrodes are arranged in the processing chamber and semiconductor wafers are placed on the electrodes. High frequency voltage is applied between the paired parallel electrodes to generate electric field of high frequency, perpendicular to the process face of the wafer, in the processing chamber. Etching gas is introduced into the processing chamber and made plasma in it. An electron supply chamber provided with an electron generating filament therein is connected to the processing chamber. Electrons generated in the electron supply chamber are induced into the processing chamber by induction magnetic field and help the etching gas be made plasma.

19 Claims, 3 Drawing Sheets

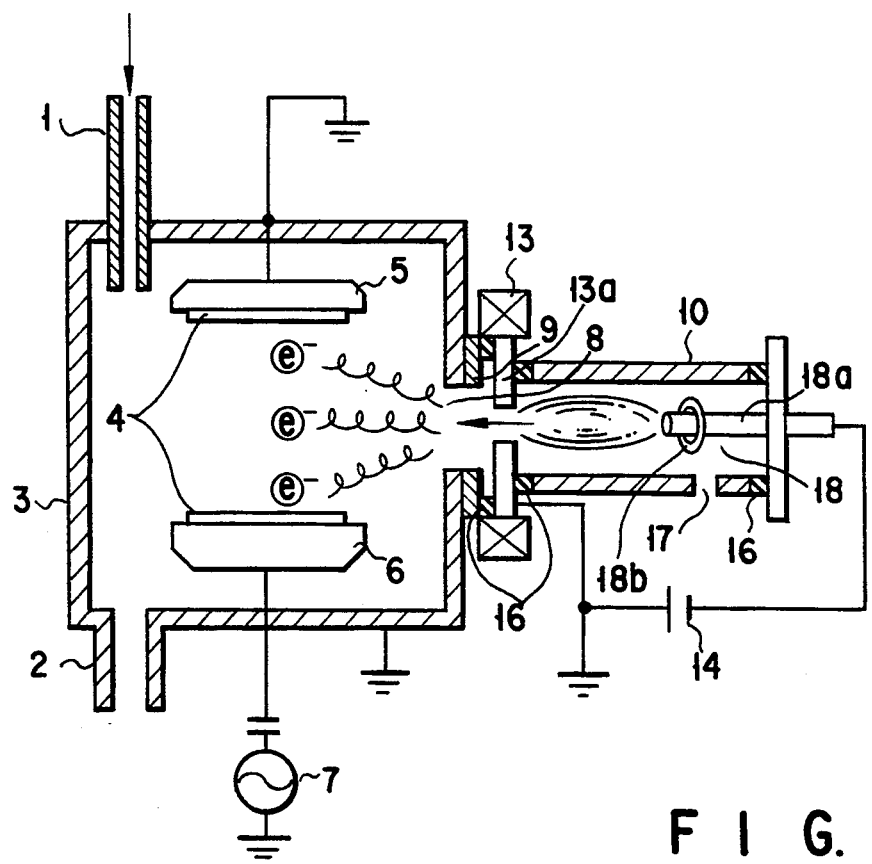
F I G. 3
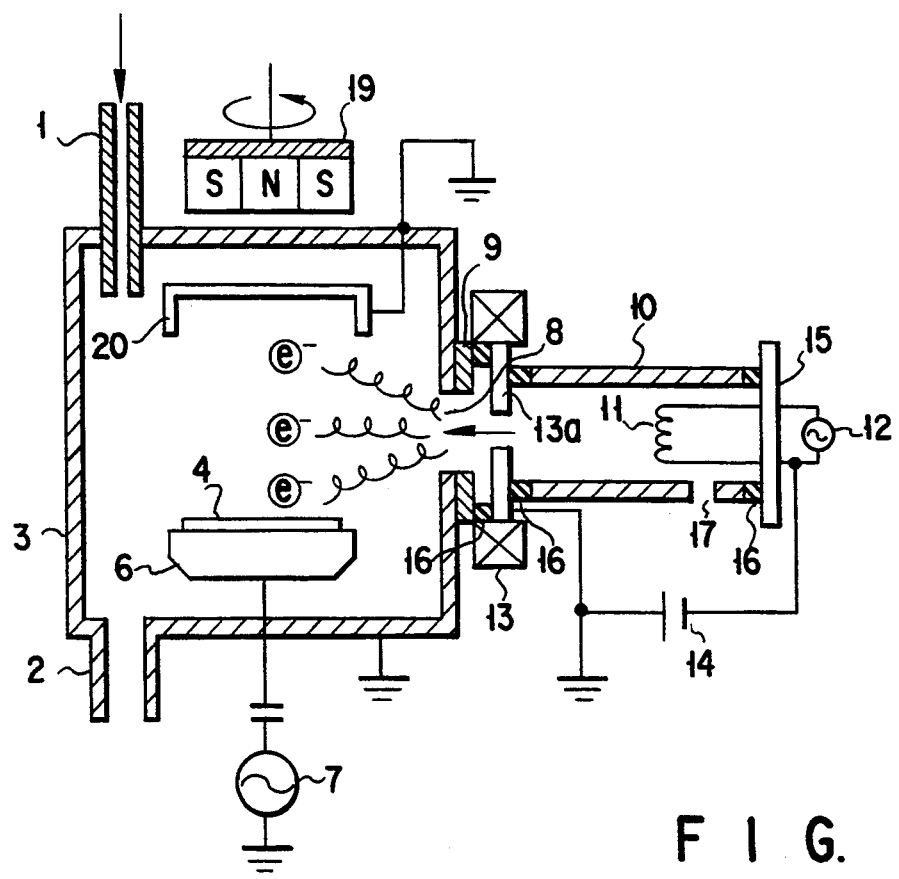
F I G. 5

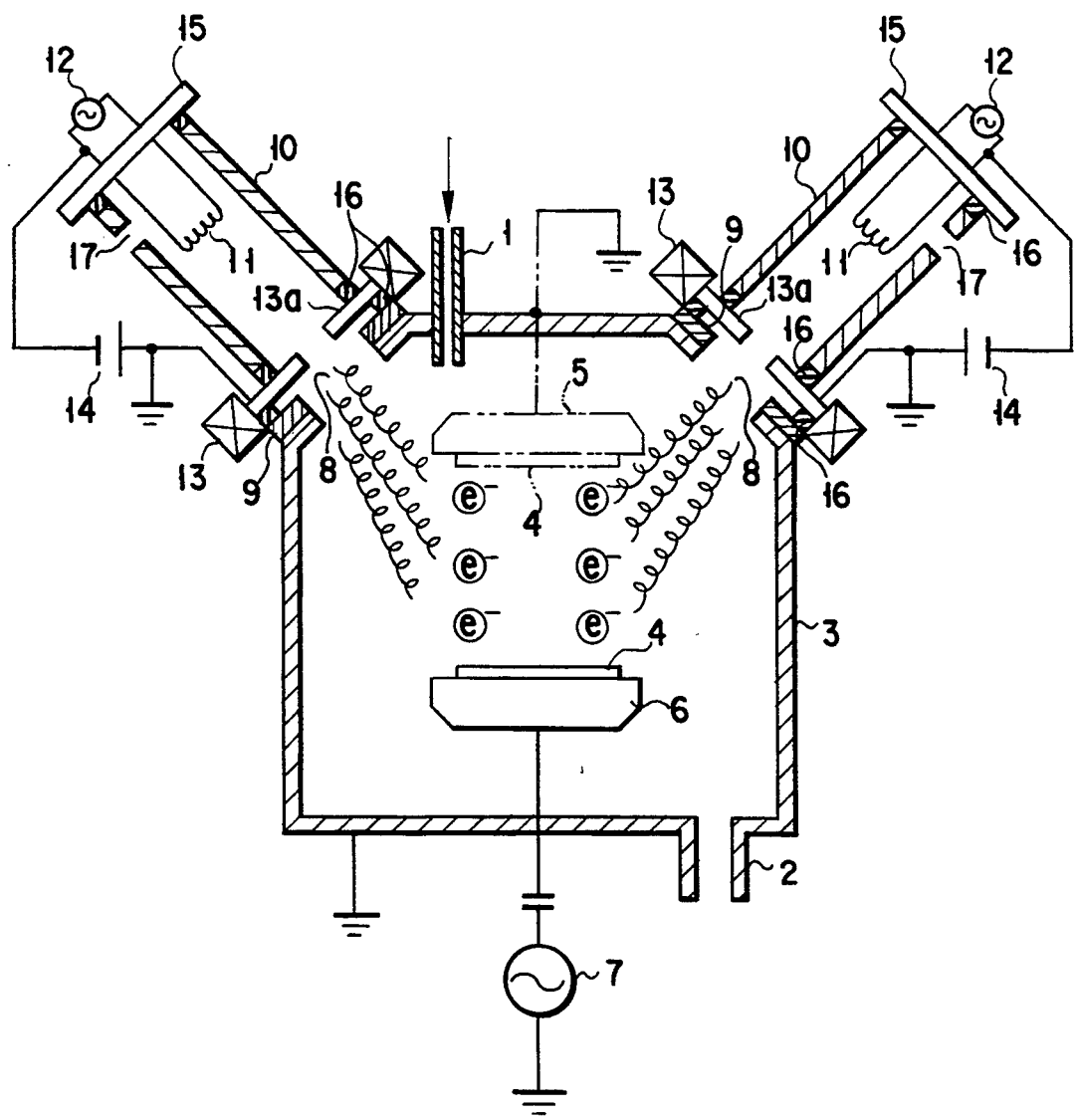
F I G. 4

PLASMA PROCESSING APPARATUS COMPRISING ELECTRON SUPPLY CHAMBER AND HIGH FREQUENCY ELECTRIC FIELD GENERATION MEANS

This application is a continuation of application Ser. No. 07/861,386, filed on Mar. 31, 1992, now abandoned.

BACKGROUND OF THE INVENTION

1. Field of the Invention

The present invention relates to a processing apparatus in which plasma is used and, more particularly, it relates to an apparatus for carrying out the etching or film-forming process in the course of manufacturing semiconductor devices, for example.

2. Description of the Related Art

Those processing apparatuses such as plasma etching and CVD ones wherein a plasma atmosphere is created in a vacuum processing chamber to plasma-process substrates housed therein to be processed are conventionally used in the course of manufacturing semiconductors. The apparatuses of this kind are intended to use the plasma of reactive gas generated by plasma generator means and to apply the etching or film-forming process to semiconductor wafers in the vacuum processing chamber.

As semiconductor devices are made finer, it is required that the semiconductor wafers can be more finely processed by the plasma process. In order to achieve this, the reactive gas must be made a plasma at a higher efficiency while keeping the degree of vacuum in the vacuum processing chamber higher.

As the degree of vacuum in the processing chamber is made higher and higher, the probability that gas particles collide with electrons is further reduced. When the degree of vacuum in the processing chamber is made high, therefore, it becomes difficult that the reactive gas is efficiently made plasma by the processing apparatus of the planar plasma type or by the RIE apparatus commonly-used. This makes it impossible for these conventional apparatuses to apply a fully fine process to the semiconductor wafers.

In order to solve this problem, a processing apparatus in which the magnetron plasma or ECR system is used has been proposed. The magnetron plasma system includes a means for generating a magnetic field parallel to the semiconductor wafers, and it is intended to create magnetron discharge by the magnetic field thus generated and by an electric field perpendicular to the magnetic field. On the other hand, the ECR system is intended to diffuse plasma flow along the diffusion field created by the magnetic field.

In the case of the magnetron plasma system, however, the reactive gas can be made plasma under some degree of vacuum but it is difficult to efficiently make it plasma under a higher degree of vacuum. In the case of the ECR system, the apparatus must be made larger in size, thereby making its cost higher.

SUMMARY OF THE INVENTION

The present invention is therefore intended to eliminate the above-mentioned drawbacks.

Accordingly, an object of the present invention is to provide a plasma apparatus smaller in size but capable of more efficiently making the processing gas plasma even under a higher degree of vacuum.

Another object of the present invention is to provide a plasma apparatus capable of creating a plasma atmosphere at a power lower than 100W as an aim in the practical operation.

According to a first aspect of the present invention, there can be provided an apparatus for processing a substrate while using plasma, comprising: a processing chamber adjustable to be highly decompressed; means for supporting the substrate in the processing chamber; means for generating an electric field of high frequency in the processing chamber; means for introducing processing gas, which is to be made plasma, into the processing chamber; an electron supply chamber connected to the processing chamber through a path electron generator means arranged in the electron supply chamber; and means for generating an induction magnetic field in the path to induce electrons from the electron supply chamber into the processing chamber.

According to a second aspect of the present invention, there can be provided an apparatus for etching a semiconductor wafer while using plasma, comprising: a processing chamber adjustable to be highly decompressed; means for supporting the wafer in the processing chamber; a pair of parallel electrodes arranged in the processing chamber, said support means being formed on an opposed surface of one of the parallel electrodes; a high frequency power source for applying high frequency voltage across the paired parallel electrodes to generate an electric field of high frequency, perpendicular to the process face of said wafer, in the processing chamber; means for introducing etching gas, which is to be made a plasma, into the processing chamber; an electron supply chamber connected to the processing chamber through a path; electron generator means arranged in the electron supply chamber; and means for generating an induction magnetic field in the path to induce electrons from the electron supply chamber into the processing chamber.

It is desirable that a gate valve is arranged in the path to open and close it between the processing chamber and the electron supply chamber. A coil or permanent magnet, for example, can be used as the induction magnetic field generator means. Plural electron supply chambers may be provided in order to uniformly introduce electrons into the processing chamber. An electrostatic deflection plate which serves as another means for uniformly introducing electrons into the processing chamber may be located at the electron inlet. The direction in which electrons are induced can be adjusted by this electrostatic deflection plate.

If it can generate electrons in the electron supply chamber, any means may be used as the electron generator means. Thermionic discharge means including a filament or a glow discharge means including a gas discharge member, for example, can be used.

According to the processing apparatus of the present invention arranged as described above, low energy electrons generated by the electron generator means can be introduced into the processing chamber, which is kept more highly decompressed, by an induction field. The electrons thus introduced can contribute to activating 10 and decomposing the reactive gas, which is supplied into the processing chamber, by making it a plasma. Therefore, the processing gas can be more efficiently made a plasma even under a higher degree of vacuum and a desired process can be more efficiently applied to substrates which are to be processed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view schematically showing the plasma etching apparatus according to a second embodiment of the present invention;

FIG. 4 is a sectional view schematically showing the plasma etching apparatus according to a third embodiment of the present invention; and FIG. 5 is a sectional view schematically showing the plasma etching apparatus according to a fourth embodiment of the present invention.

DETAILED DESCRIPTION OF THE PREFERRED EMBODIMENTS

Some embodiments of the present invention will be described in detail with reference to the accompanying drawings.

FIRST EMBODIMENT

Figure 1:
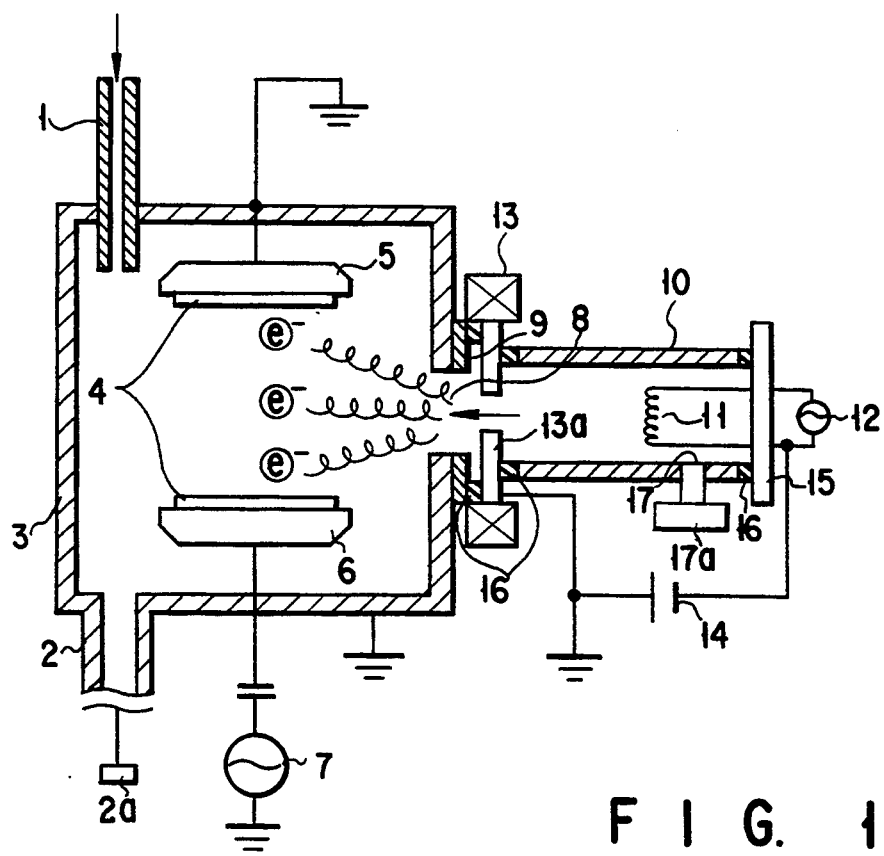
FIG. 1 is a sectional view schematically showing the plasma etching apparatus according to a first embodiment of the present invention.
Figure 2:
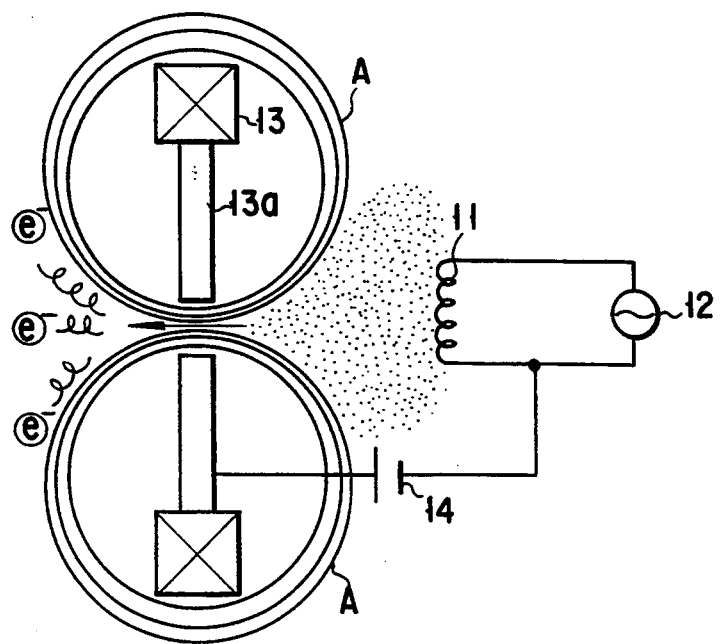
FIG. 2 schematically shows the main portion of the plasma etching apparatus enlarged.

FIG. 1 is a sectional view schematically showing the plasma etching apparatus according to a first embodiment of the present invention and FIG. 2 shows the main portion of the plasma etching apparatus enlarged.

The processing apparatus of the present invention in which plasma is used includes a vacuum processing chamber 3 which is an Al-made box provided with a reactive gas supply pipe 1 and an exhaust pipe 2 connected to suction means 2a. A pair of susceptors 5 and 6 are opposed to each other to hold substrates or semiconductor wafers 4 thereon in the processing chamber 3. The lower susceptor 6 is connected to a high frequency power source 7 while the upper one 5 is grounded. The processing chamber 3 is also grounded. The pressure in the processing chamber 3 is set $1 \times 10^{-4} - 1 \times 10^{-3}$ Torr.

Plasma discharge is generated between the susceptors 5 and 6 in the processing chamber 3 by the high frequency power source 7. Reactive gas supplied into the processing chamber 3 through the supply pipe 1 is thus made plasma to create plasma atmosphere in the processing chamber 3.

An electron inlet 8 is formed at a side wall of the processing chamber 3. An electron supply chamber 10 is connected to the electron inlet 8 through a gate valve 9.

A filament 11 which serves as electron generator means is arranged in the electron supply chamber 10, extending to the electron inlet 8. Power (of 10A and 15-20V, for example) is applied from an AC power source 12, located outside the electron supply chamber 10, to the filament 11 to generate thermions or thermoelectrons. The filament 11 may be heated by a DC power source.

A coil magnet 13 and an electrode 13a provided with a central orifice having a diameter of 3-10 mm, both of which serve as means for generating a magnetic field to direct the emitted electrons, are located adjacent to the electron inlet 8 in the electron supply chamber 10. A DC power source 14 (of 20-30V, for example) is connected at the anode side to the electrode 13a and at the cathode side to the filament 11. The electrode 13a and the anode side of the DC power source 14 are grounded. When electrical power is applied from the AC power source 12 to the filament 11 while keeping the coil magnet 13 excited (or keeping their center magnetic field at a range of 500-600 gauss), therefore, discharge is caused between the filament 11 and the electrode 13a to generate low energy electrons. These electrons move toward the electrode 13a while being induced and guided into the processing chamber 3 along magnetic field A generated by the coil magnet 13 (see FIG. 2).

Insulating members 16 are interposed between the electron supply chamber 10 and the processing chamber 3 and also between the electron supply chamber 10 and a filament attaching plate 15. The electron supply chamber 10 has an exhaust outlet 17 connected to a suction means 17a, thereby enabling the electron supply chamber 10 to be kept in a vacuum state ($10^{-1}$ Torr).

In the case of the plasma etching apparatus arranged as described above, low energy electrons created by the filament 11 are introduced into the processing chamber 3 along the magnetic field A caused by the coil magnet 13. These electrons thus introduced into the processing chamber 3 activate the reactive gas supplied into the processing chamber 3 through the supply pipe 1. Plasma discharge is therefore generated by high frequency current or power applied from the high frequency power source 7 across the susceptors 5 and 6. The semiconductor wafers 4 are etched by ions, electrons and neutral active species in the plasma thus generated.

The introduction of electrons into the processing chamber 3 may be continuously carried out while conducting the plasma process, or it may be arranged that electrons are introduced into the processing chamber 3 at the start of the processing operation and plasma discharge is conducted and that the gate valve 9 is then closed to stop the supply of electrons.

Although the susceptors 5 and 6 have been opposed to each other in the above-described case, the lower susceptor 6 may be used alone or an additional susceptor may be located on one side of the upper and lower opposed susceptors 5 and 6.

SECOND EMBODIMENT

FIG. 3 is a sectional view schematically showing the plasma etching apparatus according to a second embodiment of the present invention.

The second plasma etching apparatus includes a different electron generator means. More specifically, the electron generator means is a gas electric discharge member 18 attached to that side of the electron supply chamber 10 which is opposed to the electron inlet 8 of the processing chamber 3. The gas discharge member 18 includes a Ta-made electrode 18a and an LaB$_6$-made filament 18b.

Inactive gas such as argon (Ar) or helium (He) is introduced from a gas supply source (not shown) into the gas discharge member 18. It is preferable to use Ar gas. The DC power source 14 (40V, for example) is connected between the gas discharge member 18 and the electrode 13a in the same manner as in the above-described first embodiment.

Other components of the second embodiment are the same as those in the first embodiment. Therefore, they will be denoted by the same reference numerals and description on them will be omitted.

THIRD EMBODIMENT

FIG. 4 is a sectional view schematically showing the plasma etching apparatus according to a third embodiment of the present invention.

The third plasma etching apparatus is arranged to uniformly introduce electrons generated by the electron generator means into the processing chamber. More specifically, electron inlets 8 are formed at both upper corners of the processing chamber 3 and the electron supply chamber 10 is connected to each of these electron inlets 8. The filament 11 which serves as the electron generator means is arranged in each of the electron supply chambers 10. Although only the lower susceptor 6 has been located in the processing chamber 3 in this case, the upper susceptor 5 may be opposed to the lower one 6 as shown by a broken line.

Other components of the third embodiment are the same as those in the first and second embodiments. They will, therefore, be denoted by the same reference numerals and description on them will be omitted.

When the third plasma etching apparatus is arranged as described above, electrons introduced from two electron supply chambers 10 into the processing chamber 3 can be kept more uniform. This enables plasma to be generated at a higher efficiency and the semiconductor wafer or wafers 4 to be etched also at a higher efficiency.

Although two electron inlets 8 have been formed at both upper corners of the processing chamber 3 and the electron supply chambers 10 have been connected to them in the third example, they may be located at any two optional positions of the processing chamber 3. Or they may be formed at three or more positions thereof. Although the filaments 11 have been used as the electron generator means in the third example, they may be replaced by the gas electric discharge members 18 used in the second example.

FOURTH EMBODIMENT

FIG. 5 is a sectional view schematically showing the plasma etching apparatus according to a fourth embodiment of the present invention.

According to this fourth embodiment, an electron supply source is added to the processing chamber 3 of the magnetron plasma etching apparatus. A magnetic field generator means 19 which generates magnetic field parallel to the semiconductor wafer 4 is located on the top of the processing chamber 3. Magnetic and electric fields are generated, perpendicular to each other, on the surface of the semiconductor 4, so that magnetron discharge occurs. The electron inlet 8 is formed at a side of the processing chamber 3 and the electron supply chamber 10 is connected to the electron inlet 8. The electron generator means (or filament) 11 is located in the electron supply chamber 10. Arranged above the susceptor 6 is a cover electrode 20 which is grounded.

When magnetron plasma is used in this manner, higher density plasma can be generated under higher vacuum to achieve a finer process, as compared with the conventional magnetron plasma etching apparatus.

Other components of the fourth embodiment are the same as those in the first to third embodiments. They therefore will be denoted by the same reference numerals and a description thereof will be omitted. Further, the gas electric discharge member 18 in the second embodiment may be used instead of the filament 11 in the fourth embodiment. Furthermore, the fourth embodiment may have plural electron supply chambers, as shown in the third embodiment.

Tests were conducted to check the relation between degree of vacuum and plasma discharge in the plasma processing apparatus of the present invention. The second plasma etching apparatus shown in FIG. 3 was used but the processing chamber 3 had only the lower susceptor 6 in this case.

The degree of vacuum in the processing chamber 3 was set at 4 m, 1 m and 0.5 m Torr. The effective power (W) of plasma discharge was set at 0.2, 0.5, 0.7, 3.5, 8 and 10W. The gate valve was kept opened and closed. Chlorine gas was used as the reactive gas.

Results thus obtained are as shown in Table 1.

It has been found from the above test results that even when the degree of vacuum in the processing chamber 3 is made extremely high, plasma atmosphere can be generated by introducing low energy electrons into the processing chamber 3. This means that the semiconductor wafers 4 can be more finely plasma-processed. Further, the plasma discharge effective power needed can be made far lower as compared with the conventional apparatus. For example, the conventional etching apparatus needs an effective power higher than 1000W, and the conventional magnetron plasma etching apparatus needs an effective power as much as about 500W. The same tests were conducted in the case where the filament 11 was used instead as the electron generator means. The same results were obtained in this case, too.

TABLE 1

| Degree of Vaccum (mTorr) | Gate | Plasma Discharge Effective Power (W) | | | | | |
|---|---|---|---|---|---|---|---|
| | | 0.2 | 0.5 | 0.7 | 3.5 | 8 | 10 |
| 4 | Opened | o | o | o | o | o | o |
| | Closed | x | x | x | o | o | o |
| 1 | Opened | x | o | o | o | o | o |
| | Closed | x | x | x | x | x | x |
| 0.5 | Opened | x | x | o | o | o | o |
| | Closed | x | x | x | x | x | x |

* o — Plasma Discharge Available
x — Plasma Discharge Not Available

The present invention can also be applied to those apparatuses in which the upper susceptor 5 is connected to the high frequency power source 7 while the lower one 6 is grounded. Further, the present invention can be applied to other plasma-processing apparatuses such as the plasma CVD apparatus.

Additional advantages and modifications will readily occur to those skilled in the art. Therefore, the invention in its broader aspects is not limited to the specific details, and representative devices, shown described herein. Accordingly, various modifications may be made without departing from the spirit or scope of the general inventive concept as defined by the appended claims and their equivalents.

We claim:

1. An apparatus for processing a substrate while using plasma, comprising:
   a processing chamber capable of attaining a vacuum state;
   means for supporting the substrate in the processing chamber;
   means for generating a high frequency electric field in the processing chamber;
   means for introducing processing gas, to be formed into plasma, into the processing chamber;
   an electron supply chamber connected to the processing chamber through a path extending in a given direction;
   electron generator means arranged in the electron supply chamber for generating electrons which pass form said electron supply chamber into said processing chamber along said path;
   an attraction electrode for attracting said electrons generated in the electron supply chamber, the attraction electrode being arranged in said path and having an opening through which said electrons pass;
   a DC power source for applying a voltage between the electron generator means and the attraction electrode such that the attraction electrode has an electric potential higher than that of the electron generator means; and
   means for generating a guiding magnetic field in the path to guide said electrons from the electron supply chamber into the processing chamber, wherein said means for generating said guiding magnetic field includes a coil magnet located around said attraction electrode such that the coil magnet and the attraction electrode have a common central axis which extends in said given direction, and wherein a plane perpendicular to said common central axis bisects said attraction electrode and said means for generating said guiding magnetic field.

2. The apparatus according to claim 1, wherein said electron generator means is thermionic discharge means comprising a filament and a power source for applying voltage to the filament to heat it.

3. The apparatus according to claim 1, wherein said electron generator means is glow discharge means comprising a gas discharge member.

4. The apparatus according to claim 1, wherein a gate valve is located in the path to open and close it between the processing chamber and the electron supply chamber.

5. The apparatus according to claim 1, wherein said processing chamber comprises a conductive box set to have a potential higher than that of the electron generator means.

6. The apparatus according to claim 1, further comprising another electron supply chamber of substantially the same type as that of said electron supply chamber and connected to be processing chamber.

7. The apparatus according to claim 1, wherein said means for generating electric field comprises a pair of electrodes arranged in the processing chamber, and a high frequency power source for applying high frequency voltage across the paired electrodes.

8. The apparatus according to claim 1, wherein said support means comprises means for supporting a semiconductor wafer.

9. The apparatus according to claim 1, further comprising exhausting means connected to the electron supply chamber such that the electron supply chamber can attain a vacuum state independently of the processing chamber.

10. The apparatus according to claim 1, wherein the opening of the attraction electrode has a diameter of 3 to 10 mm.

11. The apparatus according to claim 1, wherein the guiding magnetic field causes said electrons to converge from the electron supply chamber to the opening of the attraction electrode.

12. An apparatus for etching a semiconductor wafer using plasma, comprising:
   a processing chamber capable of attaining a vacuum state;
   means for supporting the wafer in the processing chamber;
   a pair of parallel electrodes arranged in the processing chamber, the support means being formed on a surface of one of the parallel electrodes opposite to the other of said parallel electrodes;
   a high frequency power source for applying high frequency voltage between the pair of parallel electrodes for generating an electric field of high frequency, perpendicular to a face of the wafer to be processed, in the processing chamber;
   means for introducing etching gas, to be formed into plasma, into the processing chamber;
   an electron supply chamber connected to the processing chamber through a path extending in a given direction;
   electron generator means arranged in the electron supply chamber for generating electrons which pass from said electron supply chamber into said processing chamber along said path;
   an attraction electrode for attracting said electrons generated in the electron supply chamber, the attraction electrode being arranged in said path and having an opening through which said electrons pass;
   a DC power source for applying a voltage between the electron generator means and the attraction electrode such that the attraction electrode has an electric potential higher than that of the electron generator means; and
   means for generating a guiding magnetic field in said path to guide said electrons from the electron supply chamber into the processing chamber, wherein said means for generating said guiding magnetic field includes a coil magnet located around said attraction electrode such that the coil magnet and the attraction electrode have a common central axis which extends in said given direction, and wherein a plane perpendicular to said common central axis bisects said attraction electrode and said means for generating said guiding magnetic field.

13. The apparatus according to claim 12, further comprising means for generating magnetic field parallel to the process face of said wafer.

14. The apparatus according to claim 12, wherein a gate valve is arranged in the path to open and close it between the processing chamber and the electron supply chamber.

15. The apparatus according to claim 12, wherein said processing chamber comprises a conductive box set to have a potential higher than that of said electron generator means.

16. The apparatus according to claim 12, further comprising exhausting means connected to the electron supply chamber such that the electron supply chamber can attain a vacuum state independently of the processing chamber.

17. The apparatus according to claim 12, wherein the opening of the attraction electrode has a diameter of 3 to 10 mm.

18. The apparatus according to claim 12, wherein the guiding magnetic field causes said electrons to converge from the electron supply chamber to the opening of the attraction electrode.

19. An apparatus for processing a substrate while using plasma, comprising:
 a processing chamber capable of attaining a vacuum state;
 means for supporting the substrate in the processing chamber;
 means for generating a high frequency electric field in the processing chamber;
 means for introducing processing gas, to be formed into plasma, into the processing chamber;
 an electron supply chamber connected to the processing chamber through a path extending in a given direction;
 electron generator means arranged in the electron supply chamber for generating electrons which pass from said electron supply chamber into said processing chamber along said path;
 an attraction electrode for attracting said electrons generated in the electron supply chamber, the attraction electrode being arranged in said path and having an opening through which said electrons pass;
 a DC power source for applying a voltage between the electron generator means and the attraction electrode such that the attraction electrode has an electric potential higher than that of the electron generator means; and
 means for generating a guiding magnetic field in the path to guide said electrons from the electron supply chamber into the processing chamber, wherein said means for generating said guiding magnetic field is disposed around the outer circumference of the attraction electrode so as to be in intimate contact with the attraction electrode, and wherein said means for generating said guiding magnetic field includes a coil magnet located around said attraction electrode such that the coil magnet and the attraction electrode have a common central axis which extends in said given direction, and wherein a plane perpendicular to said common central axis bisects said attraction electrode and said means for generating said guiding magnetic field.

* * * * *